United States Patent
Agrawal et al.

(10) Patent No.: US 11,543,860 B2
(45) Date of Patent: *Jan. 3, 2023

(54) ADAPTIVE GRIP SUPPRESSION TUNING

(71) Applicant: Motorola Mobility LLC, Chicago, IL (US)

(72) Inventors: Amit Kumar Agrawal, Bangalore (IN); Olivier David Meirhaeghe, Lincolnshire, IL (US); Fred Allison Bower, III, Durham, NC (US)

(73) Assignee: Motorola Mobility LLC, Chicago, IL (US)

( * ) Notice: Subject to any disclaimer, the term of this patent is extended or adjusted under 35 U.S.C. 154(b) by 66 days.

This patent is subject to a terminal disclaimer.

(21) Appl. No.: 16/944,037

(22) Filed: Jul. 30, 2020

(65) Prior Publication Data

US 2022/0035412 A1  Feb. 3, 2022

(51) Int. Cl.
| | |
|---|---|
| *G06F 3/0487* | (2013.01) |
| *G06F 1/16* | (2006.01) |
| *H05K 5/02* | (2006.01) |
| *G06F 3/041* | (2006.01) |

(Continued)

(52) U.S. Cl.
CPC .......... *G06F 1/1656* (2013.01); *G06F 1/1643* (2013.01); *G06F 3/0418* (2013.01); *G06F 3/0487* (2013.01); *G06F 3/04886* (2013.01); *H04M 1/0269* (2022.02); *H05K 5/023* (2013.01)

(58) Field of Classification Search
CPC .......... G06F 1/1656; G06F 2200/1636; G06F 2203/04101; G06F 2203/04808; G06F 3/044; G06F 3/0445; G06F 3/04815; G06F 3/04842; G06F 3/0488; G06F 3/04883;

(Continued)

(56) References Cited

U.S. PATENT DOCUMENTS

| | | |
|---|---|---|
| 8,493,342 B2 | 7/2013 | Park et al. |
| 8,769,431 B1 | 7/2014 | Prasad |
| 8,924,894 B1 | 12/2014 | Yaksick et al. |

(Continued)

OTHER PUBLICATIONS

"Final Office Action", U.S. Appl. No. 16/903,717, dated Jun. 7, 2021, 13 pages.

(Continued)

*Primary Examiner* — Rayeez R Chowdhury
(74) *Attorney, Agent, or Firm* — FIG. 1 Patents

(57) ABSTRACT

In aspects of adaptive grip suppression, a wireless device has a display screen with curved display edges to display a selectable element in a region of a curved display edge. The wireless device implements an adaptive control module to adaptively tune grip suppression in the curved display edges of the display screen, which limits a device application action from being initiated based on inadvertent touch inputs on the selectable element. The adaptive control module can adaptively tune the grip suppression by decreasing the grip suppression in the region of the curved display edge proximate the selectable element responsive to false rejects indicating that the device application action is not initiating responsive to intended touch inputs, or by increasing the grip suppression in the region of the curved display edge proximate the selectable element responsive to false accepts indicating that the device application action is initiating responsive to inadvertent touch inputs.

20 Claims, 9 Drawing Sheets

(51) Int. Cl.
*H04M 1/02* (2006.01)
*G06F 3/04886* (2022.01)

(58) Field of Classification Search
CPC ........ G06F 3/16; G06F 1/1643; G06F 3/0418; G06F 3/0487; G06F 3/04886
See application file for complete search history.

(56) References Cited

U.S. PATENT DOCUMENTS

| | | | |
|---|---|---|---|
| 9,401,984 | B1* | 7/2016 | Alameh ................ H03K 17/96 |
| 9,851,883 | B2 | 12/2017 | Terrero et al. |
| 10,572,007 | B2 | 2/2020 | Agarwal et al. |
| 10,817,173 | B2 | 10/2020 | DeBates et al. |
| 10,831,318 | B2* | 11/2020 | Liu ...................... G06F 3/0445 |
| 11,287,972 | B1 | 3/2022 | Bower et al. |
| 11,508,276 | B2 | 11/2022 | Agrawal et al. |
| 2005/0012723 | A1 | 1/2005 | Pallakoff |
| 2010/0117975 | A1 | 5/2010 | Cho |
| 2011/0082620 | A1 | 4/2011 | Small et al. |
| 2011/0117970 | A1 | 5/2011 | Choi |
| 2012/0032979 | A1 | 2/2012 | Blow et al. |
| 2012/0075351 | A1 | 3/2012 | Imai et al. |
| 2013/0038564 | A1 | 2/2013 | Ho |
| 2013/0159931 | A1* | 6/2013 | Lee ..................... G06F 3/04817 715/846 |
| 2013/0222338 | A1* | 8/2013 | Gim .................... G06F 3/04186 345/173 |
| 2013/0324093 | A1 | 12/2013 | Santamaria et al. |
| 2013/0342672 | A1 | 12/2013 | Gray et al. |
| 2014/0051406 | A1 | 2/2014 | Kim et al. |
| 2015/0261376 | A1 | 9/2015 | Kim et al. |
| 2015/0363086 | A1 | 12/2015 | Uno |
| 2016/0062515 | A1* | 3/2016 | Bae ....................... G06F 3/0416 345/174 |
| 2016/0110098 | A1 | 4/2016 | Stewart et al. |
| 2016/0291731 | A1* | 10/2016 | Liu ..................... G06F 3/04883 |
| 2016/0291764 | A1* | 10/2016 | Herring ................ G06F 3/0488 |
| 2016/0313966 | A1 | 10/2016 | Jeong et al. |
| 2016/0320866 | A1 | 11/2016 | Parham |
| 2016/0320966 | A1 | 11/2016 | Ryu et al. |
| 2017/0102872 | A1 | 4/2017 | Kim et al. |
| 2017/0212631 | A1 | 7/2017 | Kim et al. |
| 2017/0231148 | A1 | 8/2017 | Miwa |
| 2017/0366555 | A1 | 12/2017 | Matus |
| 2018/0239482 | A1 | 8/2018 | Hinckley |
| 2018/0242242 | A1 | 8/2018 | Lee et al. |
| 2019/0018461 | A1 | 1/2019 | DeBates et al. |
| 2019/0018588 | A1 | 1/2019 | DeBates et al. |
| 2019/0020760 | A1 | 1/2019 | DeBates et al. |
| 2019/0052744 | A1 | 2/2019 | Jung et al. |
| 2019/0179487 | A1* | 6/2019 | Kong ................... G06F 3/0416 |
| 2020/0201501 | A1 | 6/2020 | Rho et al. |
| 2021/0397264 | A1 | 12/2021 | Jain et al. |
| 2022/0038572 | A1 | 2/2022 | Agrawal et al. |
| 2022/0066564 | A1 | 3/2022 | Agrawal et al. |
| 2022/0091737 | A1 | 3/2022 | Bower et al. |
| 2022/0093023 | A1 | 3/2022 | Agrawal et al. |

OTHER PUBLICATIONS

"Non-Final Office Action", U.S. Appl. No. 17/025,170, dated Jun. 18, 2021, 10 pages.
"Final Office Action", U.S. Appl. No. 17/025,170, dated Dec. 7, 2021, 9 pages.
"Non-Final Office Action", U.S. Appl. No. 17/002,027, dated Nov. 23, 2021, 13 pages.
"Non-Final Office Action", U.S. Appl. No. 16/944,007, dated Nov. 9, 2021, 15 pages.
"Non-Final Office Action", U.S. Appl. No. 17/025,131, dated Dec. 7, 2021, 20 pages.
"Notice of Allowance", U.S. Appl. No. 17/025,170, dated Jan. 31, 2022, 10 pages.
Agrawal, Amit Kumar et al., "U.S. Application as Filed", U.S. Appl. No. 17/575,338, filed Jan. 13, 2022, 64 pages.
Bandameedipalli, Jyothsna et al., "U.S. Application as Filed", U.S. Appl. No. 17/575,356, filed Jan. 13, 2022, 63 pages.
"Non-Final Office Action", U.S. Appl. No. 16/903,717, dated Nov. 10, 2020, 11 pages.
"Non-Final Office Action", U.S. Appl. No. 16/903,717, dated Mar. 15, 2022, 12 pages.
"Supplemental Notice of Allowability", U.S. Appl. No. 17/025,170, dated Mar. 3, 2022, 3 pages.
U.S. Appl. No. 16/944,007 , "Advisory Action", U.S. Appl. No. 16/944,007, dated Aug. 8, 2022, 3 pages.
U.S. Appl. No. 16/944,007 , "Final Office Action", U.S. Appl. No. 16/944,007, dated May 31, 2022, 17 pages.
U.S. Appl. No. 17/025,131 , "Final Office Action", U.S. Appl. No. 17/025,131, dated Jun. 22, 2022, 25 pages.
U.S. Appl. No. 17/025,131 , "Notice of Allowance", U.S. Appl. No. 17/025,131, dated Aug. 17, 2022, 10 pages.
U.S. Appl. No. 16/903,717, "Notice of Allowance", U.S. Appl. No. 16/903,717, dated Sep. 21, 2022, 5 pages.
U.S. Appl. No. 16/903,717, "Supplemental Notice of Allowability", U.S. Appl. No. 16/903,717, dated Nov. 3, 2022, 2 pages.
U.S. Appl. No. 17/025,131, "Corrected Notice of Allowability", U.S. Appl. No. 17/025,131, dated Aug. 30, 2022, 2 pages.
U.S. Appl. No. 17/025,131, "Corrected Notice of Allowability", U.S. Appl. No. 17/025,131, dated Oct. 26, 2022, 2 pages.

* cited by examiner

ADAPTIVE GRIP SUPPRESSION TUNING

BACKGROUND

Devices such as smart devices, mobile devices (e.g., cellular phones, tablet devices, smartphones), consumer electronics, and the like can be implemented with various display screen configurations. For example, a smartphone may be implemented with a display screen that is flat and encompasses most of one side of the device. More recently, some mobile devices are designed with a curved display screen that wraps around all or part of the vertical sides of a device. Generally, a curved display screen has a curved edge display on both vertical sides of a device, and the curved edge displays can be used to display user interface content and other display screen content.

While the curved edges of a curved display screen generally enhances the aesthetics of a device, the curved edges introduce various design and usability challenges, particularly for user interface selectable controls that may be displayed within the curved edge display. For example, different users have different finger sizes and ways of holding a device, which leads to challenges optimizing device grip suppression and false touches on the curved edges of the display screen, such as when also providing touch functionality of user interface selectable controls that may be displayed within the curved edge display. For example, a user of a device may attempt to select a particular user interface control that is displayed within the curved edge display of the device display screen, but as a false reject, the user interface control is not activated. Alternatively, the user of the device may not intend to select a particular user interface control that is displayed within the curved edge display of the device display screen, but as a false accept, the user interface control is activated due to inadvertent contact with the user interface control.

BRIEF DESCRIPTION OF THE DRAWINGS

Implementations of the techniques for adaptive grip suppression are described with reference to the following Figures. The same numbers may be used throughout to reference like features and components shown in the Figures.

DETAILED DESCRIPTION

Figure 1:
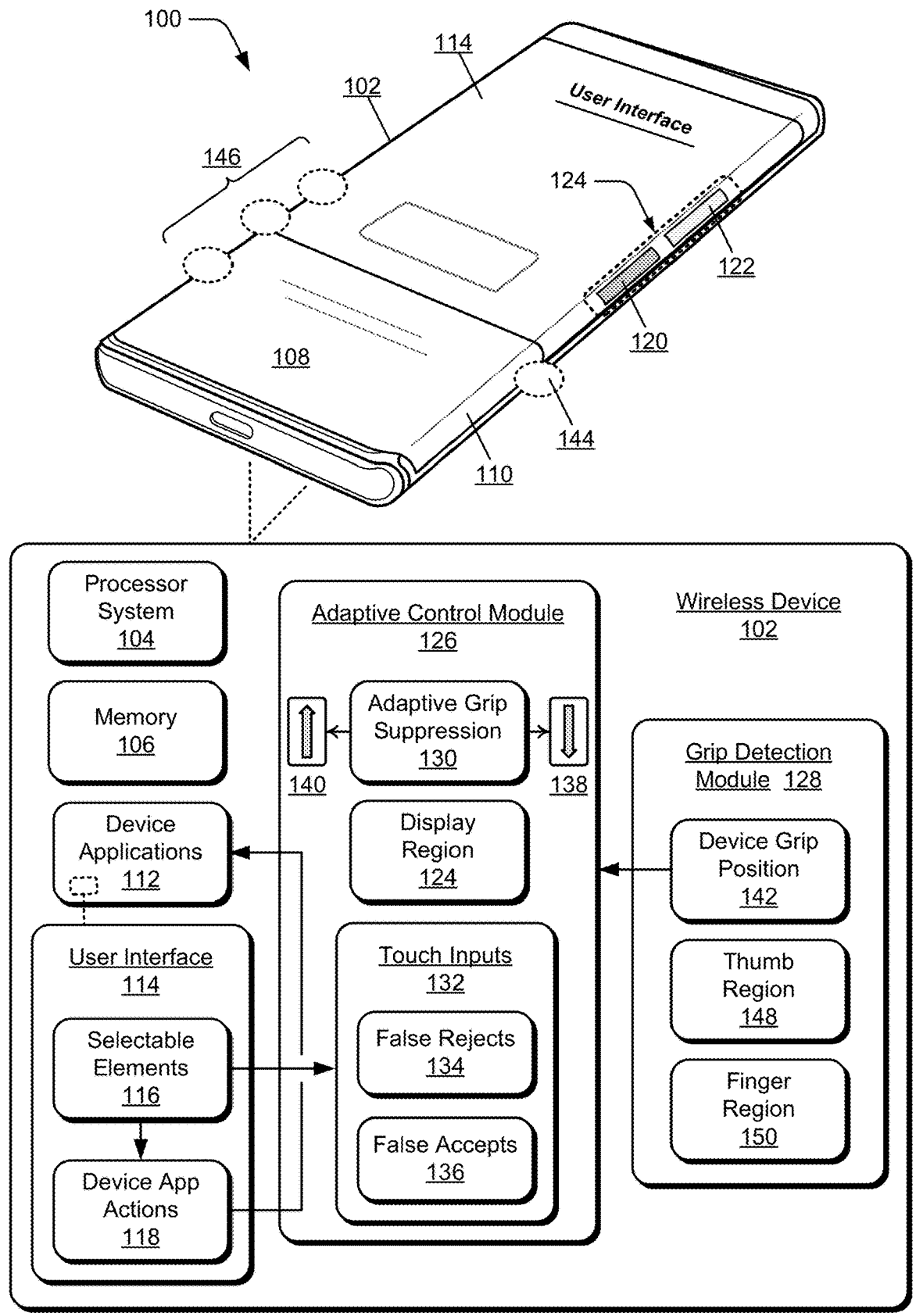
FIG. 1 illustrates an example of techniques for adaptive grip suppression using a wireless device in accordance with one or more implementations as described herein.

Implementations of adaptive grip suppression are described, and provide techniques that can be implemented by a wireless device. Techniques for adaptive grip suppression within curved display edges of a display screen can be implemented to identify where a selectable element of a user interface is displayed within a curved display edge of the display screen, and lessen the grip suppression in an area around the selectable element. This is adaptive grip suppression based on where selectable elements are displayed in a user interface. Generally, the wireless device has the display screen that is a curved display, which wraps around all or part of the vertical sides of the wireless device, and has curved display edges on both vertical sides of the device. The wireless device can include many different types of device applications, many of which generate or have a user interface that displays on the display screen of the device, and the curved display edges of the display screen can be utilized to display any type of user interface or other display screen content.

In aspects of adaptive grip suppression within curved display edges, the wireless device has the display screen with the curved display edges to display a user interface associated with a device application, and the user interface includes one or more selectable elements to initiate corresponding device application actions. The wireless device implements an adaptive control module to adaptively manage grip suppression in the curved display edges of the display screen. The grip suppression limits the device application actions from being initiated based on inadvertent touch inputs on the selectable elements. The adaptive control module can determine that a selectable element of the user interface is displayed within a region of a curved display edge of the display screen, and decrease the grip suppression in the region of the curved display edge proximate the selectable element of the user interface.

Additionally, techniques for adaptive grip suppression tuning can be implemented for learning feedback based on false rejects and false accepts. A selectable element of a user interface can be displayed within a curved display edge of the display screen, and grip suppression in an area around the selectable element can be tuned based on learning false accepts and/or false rejects associated with touch inputs on the selectable element.

The false rejects can occur when a user of the wireless device intends to initiate a device application action, but the grip suppression is set at too strong or too high of a level that prevents a touch input on a selectable element from being recognized to initiate the corresponding device application action. Typically, a user will attempt multiple touch inputs on the selectable element when the device application action fails to initiate or activate. The adaptive control module can then decrease the grip suppression to a level that allows the device application action to be initiated or activated, and can then confirm that the previous non-action user selections of a selectable element were false rejects that failed to initiate the corresponding device application action.

The false accepts can occur when an inadvertent touch selection of a selectable element is registered as a touch input, but the user of the wireless device did not intend to initiate the corresponding device application action. These inadvertent touch selections or inputs can occur when the adaptive grip suppression is set at too low of a level, which allows an inadvertent touch contact or input on a selectable element to be recognized, causing the corresponding device application action to be initiated or activated. These inadvertent touch contacts or inputs are generally detectable because, when an unintended device application action is initiated, the user of the device does not utilize the invoked action, or quickly reverses course to undo or dismiss the invoked action.

In aspects of adaptive grip suppression tuning, the wireless device has the display screen with curved display edges to display one or more selectable elements in a region of a curved display edge. The wireless device implements the adaptive control module to adaptively tune the grip suppression in the curved display edges of the display screen, which limits a device application action from being initiated based on inadvertent touch inputs on the selectable element. The adaptive control module can adaptively tune the grip suppression by decreasing the grip suppression in the region of the curved display edge proximate the selectable elements responsive to false rejects indicating that the device application action is not initiating responsive to intended touch inputs. The adaptive control module can also adaptively tune the grip suppression by increasing the grip suppression in the region of the curved display edge proximate the selectable elements responsive to false accepts indicating that the device application action is initiating responsive to inadvertent touch inputs.

While features and concepts of adaptive grip suppression can be implemented in any number of different devices, systems, environments, and/or configurations, implementations of adaptive grip suppression are described in the context of the following example devices, systems, and methods.

FIG. 1 illustrates an example 100 of techniques for adaptive grip suppression, such as implemented with a wireless device 102. In this example 100, the wireless device 102 may be any type of a mobile phone, flip phone, computing device, tablet device, and/or any other type of mobile device. Generally, the wireless device 102 may be any type of an electronic, computing, and/or communication device implemented with various components, such as a processor system 104 and memory 106, as well as any number and combination of different components as further described with reference to the example device shown in FIG. 9. For example, the wireless device 102 can include a power source to power the device, such as a rechargeable battery and/or any other type of active or passive power source that may be implemented in an electronic, computing, and/or communication device.

The wireless device 102 includes a display screen 108, which in this example 100, is a curved display that wraps around, or partially wraps, the vertical sides of the wireless device. Generally, the display screen 108 has the curved display edges 110 on both vertical sides of the wireless device, and the curved display edges can be utilized to display any type of user interface or other display screen content. The wireless device 102 also includes device applications 112, such as a text application, email application, video service application, cellular communication application, music application, and/or any other of the many possible types of device applications. Many device applications 112 have an associated user interface that is generated and displayed for user interaction and viewing. In this example 100, the display screen 108 of the wireless device 102 can display a user interface 114 that is associated with a device application 112.

The user interface 114 of a device application 112 may include one or more selectable elements 116, which are user selectable, such as with a touch input, press, hold, or tap to initiate corresponding device application actions 118. For example, the user interface 114 displayed on the display screen 108 may be associated with a music playback application (e.g., any type of a device application 112), and the user interface includes selectable elements 116, such as a selectable element 120 that a user can select with a touch input to change the song that is currently playing, and another selectable element 122 that the user can select to initiate some other device application action. In this example 100, the selectable elements 120, 122 of the user interface 114 are displayed in a region 124 of a curved display edge 110 of the display screen 108.

In this example 100, the wireless device 102 implements an adaptive control module 126 and a grip detection module 128, which can be implemented as separate modules that may include independent processing, memory, and/or logic components functioning as a computing and/or electronic device integrated with the wireless device 102. Alternatively or in addition, either of the modules can be implemented in software, in hardware, or as a combination of software and hardware components. In this example, the adaptive control module 126 and the grip detection module 128 are implemented as software applications or modules, such as executable software instructions (e.g., computer-executable instructions) that are executable with a processor (e.g., with the processor system 104) of the wireless device 102 to implement the techniques and features of adaptive grip suppression, as described herein.

As software applications or modules, the adaptive control module 126 and the grip detection module 128 can be stored on computer-readable storage memory (e.g., the memory 106 of the device), or in any other suitable memory device or electronic data storage implemented with the modules. Alternatively or in addition, the adaptive control module 126 and/or the grip detection module 128 may be implemented in firmware and/or at least partially in computer hardware. For example, at least part of the modules may be executable by a computer processor, and/or at least part of the modules may be implemented in logic circuitry.

In implementations, the adaptive control module 126 is implemented by the wireless device 102 to adaptively manage and/or tune the adaptive grip suppression 130 in the curved display edges 110 of the display screen 108, as well as in the transition regions from the flat display screen 108 into the curved display edges. The adaptive grip suppression 130 can be managed and/or tuned by the adaptive control module 126 to limit device application actions 118 from being initiated based on inadvertent touch inputs on the selectable elements 116 that are displayed in the curved display edges 110 of the display screen 108.

The adaptive control module 126 can determine, or receive notification, that the user interface 114 corresponds to a foreground active device application 112, which causes the selectable elements 116 of the user interface to be active. The adaptive control module 126 can also determine, or receive notification, that selectable elements 116 of the user interface 114 are displayed within the curved display edge 110 of the display screen 108, such as the selectable elements 120, 122 shown displayed in the display region 124 of the curved display edge 110 of the display screen. The adaptive grip suppression 130 may be initially set at a level that would allow a device application action 118 to be initiated responsive to touch inputs 132 on the selectable elements 116, such as when user inputs are received on the user interface 114 as press, hold, tap, touch, or similar type inputs.

In implementations, the touch inputs 132 are registered with the adaptive control module 126, which can be utilized to learn instances of false rejects 134 and false accepts 136. The false rejects 134 can occur when a user of the wireless device 102 intends to initiate a device application action 118, but the grip suppression 130 is set at too strong or too high of a level that prevents a touch input 132 on a selectable element 116 from being recognized to initiate the corresponding device application action. Typically, a user will attempt multiple touch inputs 132 on the selectable element 116 when the device application action 118 fails to initiate or activate. The adaptive control module 126 can decrease 138 the grip suppression 130 to a level that allows the device application action 118 to be initiated or activated, and can then conclude or confirm that the previous non-action user selections of a selectable element 116 were false rejects that failed to initiate the corresponding device application action 118.

The false accepts 136 can occur when an inadvertent touch selection of a selectable element 116 is registered as a touch input 132, but the user of the wireless device 102 did not intend to initiate the corresponding device application action 118. These inadvertent touch selections or inputs can occur when the adaptive grip suppression 130 is set at too low of a level, which allows an inadvertent touch contact or input on a selectable element 116 to be recognized, causing the corresponding device application action 118 to be initiated or activated. These inadvertent touch contacts or inputs are generally detectable because, when an unintended device application action 118 is initiated, the user of the device does not utilize the invoked action, or quickly reverses course to undo or dismiss the invoked action.

The adaptive control module 126 can decrease 138 or increase 140 the adaptive grip suppression 130 to adaptively manage and/or tune the grip suppression in the curved display edges 110 of the display screen 108, as well as in the transition regions from the flat display screen 108 into the curved display edges. For example, the adaptive control module 126 can increase 140 the grip suppression 130 in the curved display edge 110 proximate the selectable elements 120, 122 of the user interface 114, such as when false accepts 136 are identified. The adaptive control module 126 can also decrease 138 the grip suppression 130 in the display region 124 of the curved display edge 110 proximate the selectable elements 120, 122 of the user interface 114, such as when false rejects 134 are identified. The adaptive control module 126 can decrease 138 the grip suppression 130 effective to allow a user selection of the selectable elements 120, 122 in the user interface 114, as displayed within the display region 124 of the curved display edge 110 of the display screen 108, which allows the user selection to be recognized as a touch input 132 to initiate a corresponding device application action 118.

The adaptive control module 126 can also be implemented to maintain an increased level of grip suppression 130 outside of the display region 124 of the curved display edge 110 of the display screen. Although the adaptive control module 126 maintains the increased level of grip suppression 130 outside of the display region 124 of the curved display edge 110, the adaptive control module 126 can still allow for recognition of swipe and/or scrolling inputs outside of the display region 124 of the curved display edge 110 of the display screen. In implementations, the adaptive control module 126 can also maintain the increased level of grip suppression 130 to disable receiving touch inputs in the curved display edges 110, and in the transition regions from the flat display screen 108 into the curved display edges, to account for inadvertent activations that may be caused by the hand or palm coverage from a user of the device, or for device pickup movements when the user grabs the device to pick it up for use.

Generally, as described with reference to the example device shown in FIG. 9, the wireless device 102 has an operating system with a system layer (e.g., kernel layer) that can receive indications of touch input events on the user interface 114 at the device layer when a user of the wireless device attempts to activate a device application action 118 by selecting a corresponding selectable element 116. The adaptive control module 126 can register as an application, at the application layer, with the system layer to receive indications, notifications, and/or communications as to the selectable elements 116 that are displayed in a user interface 114. The adaptive control module 126 can also adjust the adaptive grip suppression 130 for the curved display edges 110 of the display screen 108 so that the user of the wireless device 102 can touch or tap on the user interface selectable elements 116 to initiate the corresponding device application actions 118.

In other implementations, the adaptive control module 126 can determine that the selectable elements 116 of the user interface 114 have moved to display outside of an identified display region of the curved display edge 110 of the display screen 108. For example, the user interface 114 may be moved to display in a different location (e.g., up or down) on the display screen 108 of the wireless device 102, which moves the location of the selectable elements 120, 122 being displayed in the display region 124 of the curved display edge 110 of the display screen. The adaptive control module 126 can then determine a new region of the curved display edge 110 of the display screen 108 in which the selectable elements 120, 122 of the user interface 114 are displayed, and decrease 138 the grip suppression 130 in the new region of the curved display edge 110 proximate the selectable elements 120, 122 displayed within the new region of the curved display edge of the display screen.

In other implementations, the adaptive control module 126 can receive a device grip position 142 of a user grip holding the wireless device 102 from the grip detection module 128. The adaptive control module 126 can then determine that the device grip position 142 is proximate the display region 124 of the curved display edge 110 in which the selectable elements 120, 122 of the user interface 114 are displayed, and decrease 138 the grip suppression 130 in the display region 124 of the curved display edge 110 proximate the selectable elements 120, 122.

The grip detection module 128 is implemented by the wireless device 102 to detect the device grip position 142 of a user grip holding the wireless device. A representation of a user grip holding the device is generally shown as a thumb position 144 on one vertical side of the wireless device 102, and finger positions 146 on the other vertical side of the device, as if a user were holding the device with his or her right hand. Typically, a user grips and holds a device with his or her thumb on one side, and two or three fingers on the other side of the device, which also likely contacts or rests in some portion of the user's palm of his or her hand. The thumb position 144, the finger positions 146, and/or the user's palm of his or her hand also likely contacts some areas of the curved display edges 110 of the display screen 108, and the adaptive grip suppression 130 can be increased in these areas to prevent inadvertent touch inputs on selectable elements 116 of the user interface 114, causing false accepts.

The grip detection module 128 can also determine which hand, left or right, the user is using to hold the wireless device 102, as well as the vertical position along the vertical sides of the device. For example, the user may grip and hold the device with his or her right hand, vertically more towards the lower section or bottom of the device, as shown in this example 100. Notably, the grip detection module 128 can determine a thumb region 148 of the device grip position 142 on a first side of the wireless device, such as proximate the thumb position 144. The grip detection module 128 can also determine a finger region 150 of the device grip position 142 on a second side of the wireless device, such as proximate the finger positions 146. In instances when a user changes hands and/or adjusts the grip position, the grip detection module 128 can detect a change in the device grip position 142 of the user grip holding the wireless device.

Figure 2:
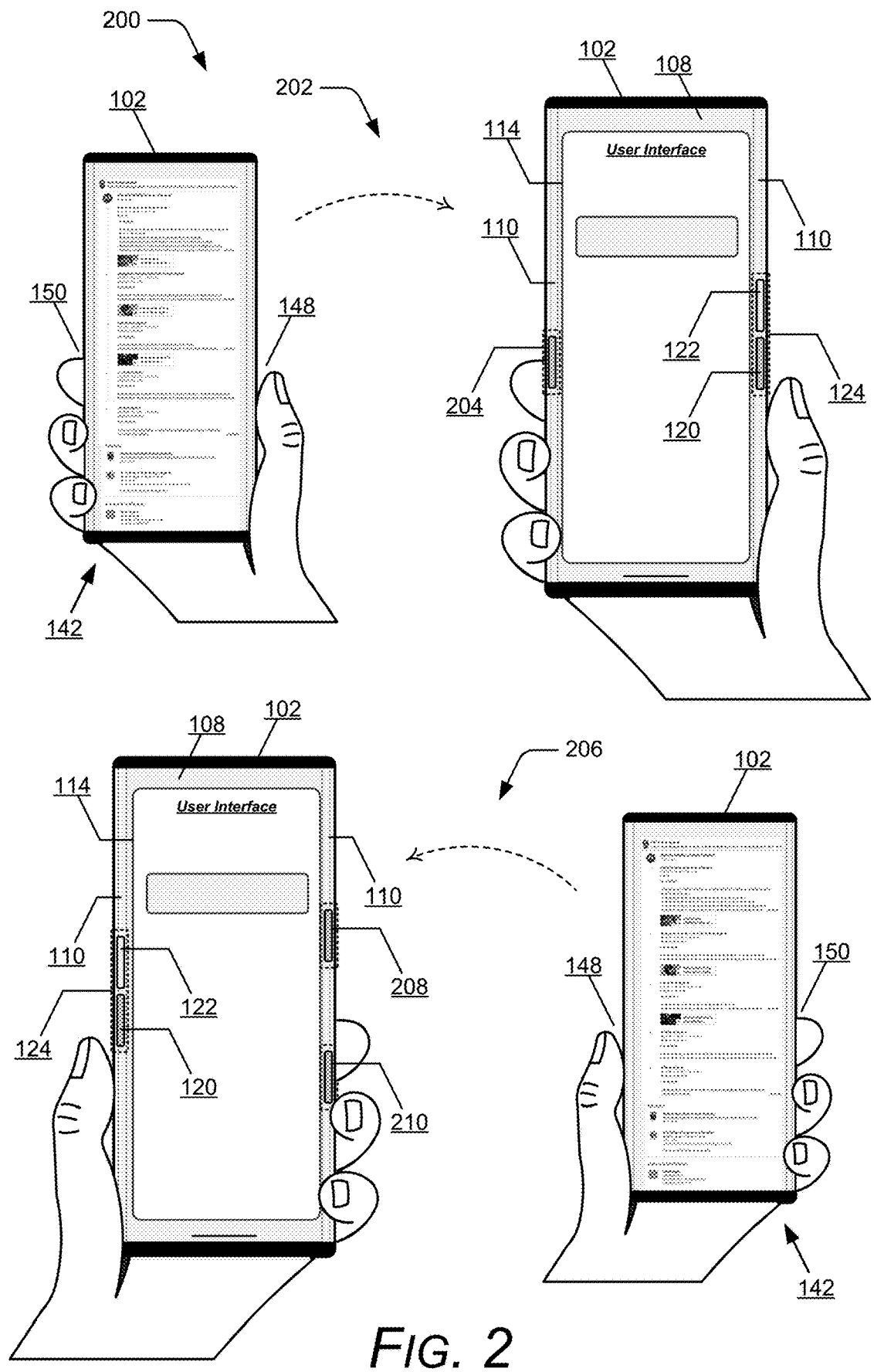
FIG. 2 illustrates examples of features for adaptive grip suppression using a wireless device in accordance with one or more implementations as described herein.

FIG. 2 illustrates examples 200 of aspects and features for adaptive grip suppression, as described herein, such as using the wireless device 102 as shown and described with reference to FIG. 1. As shown in an example 202, a user of the wireless device 102 may hold the device in his or her right hand. The grip detection module 128 that is implemented by the wireless device 102 can detect the device grip position 142 of the user grip holding the wireless device. The grip detection module 128 can determine the thumb region 148 of the device grip position 142 on a first side of the wireless device, and also determine the finger region 150 of the device grip position 142 on a second side of the wireless device.

The display screen 108 of the wireless device 102 can display the user interface 114 that is associated with a device application 112, as well as the selectable elements 120, 122 of the user interface 114 that are associated with the device application actions 118. For example, the selectable elements 120, 122 of the user interface 114 are displayed in the curved display edge 110 of the display screen 108 of the wireless device. The adaptive control module 126 can determine that the device grip position 142 is proximate the display region 124 of the curved display edge 110 in which the selectable elements 120, 122 of the user interface 114 are displayed, and decrease 138 the grip suppression 130 in the display region 124 of the curved display edge 110 proximate the selectable elements 120, 122.

In implementations, the user interface 114 may have more than one display region in the curved display edges of the display screen 108, such as two or more display regions within the same curved display edge and/or on opposite sides of the device. For example, an additional display region 204 includes another selectable element of the user interface 114, and is displayed on the opposite side of the device from the display region 124 in the curved display edge 110 of the display screen 108. The adaptive control module 126 can also determine that the device grip position 142 (finger region 150) is proximate the additional display region 204 of the curved display edge 110 in which the selectable element of the user interface 114 is displayed, and decrease 138 the grip suppression 130 in the display region 204 of the curved display edge 110.

An example 206 illustrates an instance of the user changing hands to hold the wireless device 102 in his or her left hand, and the grip detection module 128 can detect the change in the device grip position 142 of the user grip holding the device. Additionally, the selectable elements 120, 122 of the user interface 114 are displayed in the curved display edge 110 of the display screen 108 of the wireless device 102. Accordingly, the adaptive control module 126 can determine that the device grip position 142 is proximate the display region 124 of the curved display edge 110 in which the selectable elements 120, 122 of the user interface 114 are displayed, and decrease 138 the grip suppression 130 in the display region 124 of the curved display edge 110 proximate the selectable elements 120, 122. In this example, additional display regions 208, 210 include selectable elements of the user interface 114, and are displayed within the same curved display edge 110 of the display screen 108, on the opposite side of the device from the display region 124 in the curved display edge 110 of the display screen 108. The adaptive control module 126 can also determine that the device grip position 142 (finger region 150) is proximate the additional display region 210 of the curved display edge 110 in which the selectable element of the user interface 114 is displayed, and decrease 138 the grip suppression 130 in the display region 210 of the curved display edge 110.

Returning to the discussion of FIG. 1 and the example 100 of techniques for adaptive grip suppression, the adaptive control module 126 can receive the touch inputs 132 as user selections of the selectable elements 116 that are displayed in the user interface to initiate corresponding device application actions 118. The touch inputs 132 may also be received as the false rejects 134 and/or as the false accepts 136, as described above. In implementations, the adaptive control module 126 can receive notifications or indications of the false rejects 134 associated with intended touch inputs on a selectable element 120, 122 displayed within the display region 124 of the curved display edge 110 of the display screen 108, and the false rejects 134 indicate that the device application action 118 is not initiating responsive to the intended touch inputs. Notably, the adaptive control module 126 can receive the indications of the false rejects 134 as successive touch inputs 132 on a selectable element 116 to initiate the corresponding device application action 118.

The adaptive control module 126 can determine that the adaptive grip suppression 130 is set at a level higher than would allow the successive touch inputs 132 on the selectable element to initiate the device application action, and then decrease 138 the grip suppression 130 in the display region 124 of the curved display edge 110 of the display screen 108 proximate the selectable elements 120, 122 responsive to the indications of the false rejects. The adaptive control module 126 can decrease 138 the grip suppression 130 effective to allow a touch input 132 on a selectable element 120, 122 of the user interface 114 displayed within the display region 124 of the curved display edge 110 to initiate the corresponding device application action 118. The adaptive control module 126 can then confirm, based on the device application action 118 being initiated, that the successive touch inputs 132 received before the device application action 118 is initiated were false rejects 134.

In implementations, the adaptive control module 126 can receive notifications or indications of the false accepts 136 associated with inadvertent touch inputs on a selectable element 120, 122 displayed within the display region 124 of the curved display edge 110 of the display screen 108, and the false accepts 136 indicate that the device application action 118 is initiated responsive to the inadvertent touch inputs. Notably, the adaptive control module 126 can receive the indications of the false accepts 136 as user inputs to return to a previous device state of before the device application action 118 was initiated. The user inputs to return to the previous device state may also be determined to occur within a threshold time duration from when the device application action is initiated.

The adaptive control module 126 can determine that the adaptive grip suppression 130 is set at a level lower than would prevent the inadvertent touch inputs 132 on the selectable element to initiate the device application action, and then increase 140 the grip suppression 130 in the display region 124 of the curved display edge 110 of the display screen 108 proximate the selectable elements 120, 122 responsive to the indications of the false accepts. The adaptive control module 126 can increase the grip suppression 130 effective to prevent a touch input 132 on a selectable element 120, 122 of the user interface 114 displayed within the display region 124 of the curved display edge 110 from initiating the corresponding device application action 118. The adaptive control module 126 can then confirm, based on the device application action 118 not being initiated, that the previous inadvertent touch inputs on the selectable element were false accepts.

Example methods 300, 400, and 500 are described with reference to respective FIGS. 3-5 in accordance with implementations of adaptive grip suppression within curved display edges. Additionally, example methods 600, 700, and 800 are described with reference to respective FIGS. 6-8 in accordance with implementations of adaptive grip suppression tuning based on false rejects and false accepts. Generally, any services, components, modules, methods, and/or operations described herein can be implemented using software, firmware, hardware (e.g., fixed logic circuitry), manual processing, or any combination thereof. Some operations of the example methods may be described in the general context of executable instructions stored on computer-readable storage memory that is local and/or remote to a computer processing system, and implementations can include software applications, programs, functions, and the like. Alternatively or in addition, any of the functionality described herein can be performed, at least in part, by one or more hardware logic components, such as, and without limitation, Field-programmable Gate Arrays (FPGAs), Application-specific Integrated Circuits (ASICs), Application-specific Standard Products (ASSPs), System-on-a-chip systems (SoCs), Complex Programmable Logic Devices (CPLDs), and the like.

Figure 3:
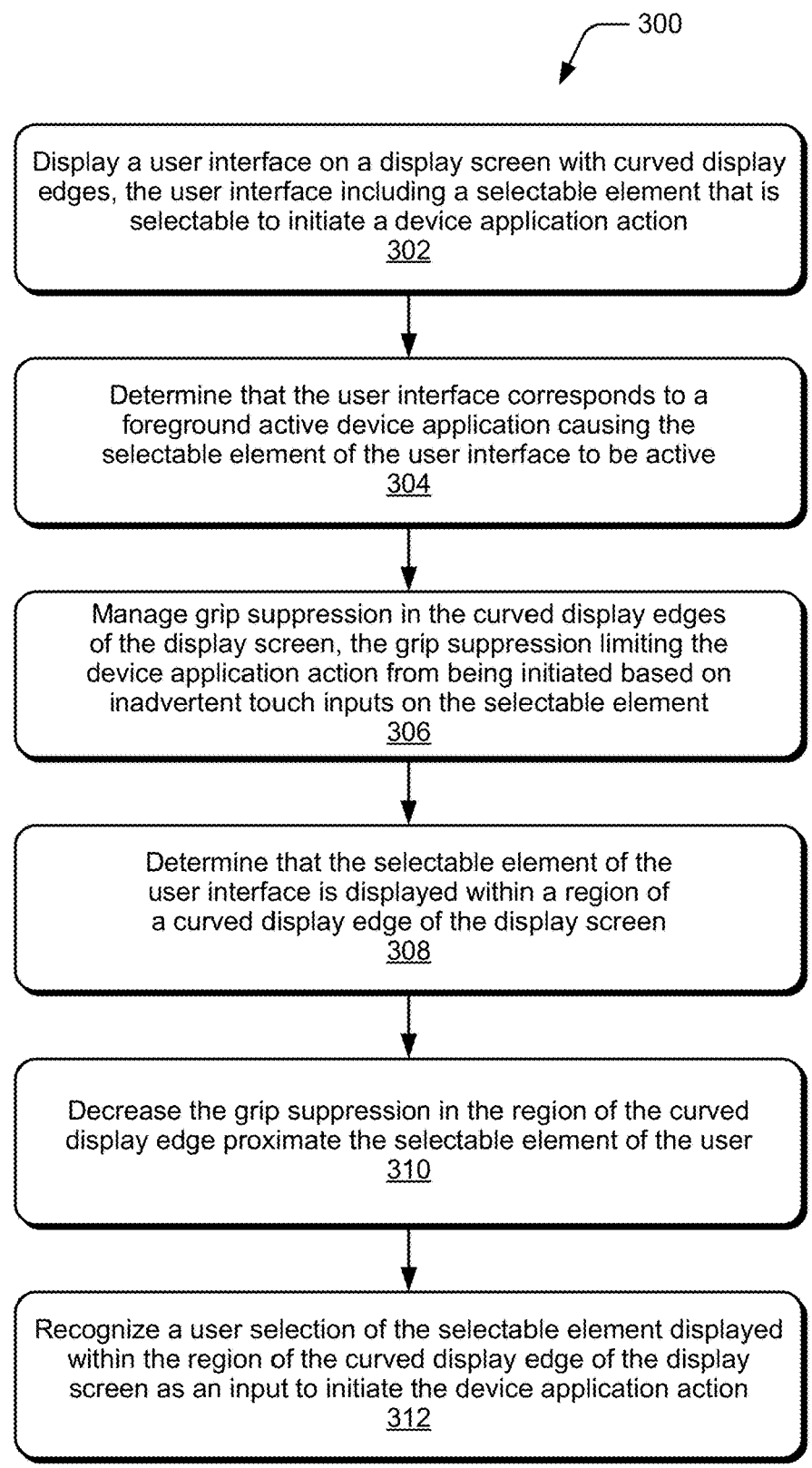
FIGS. 3-5 illustrate example methods of adaptive grip suppression within curved display edges in accordance with one or more implementations of the techniques described herein.

FIG. 3 illustrates example method(s) 300 of adaptive grip suppression, and is generally described with reference to a wireless device, as well as an adaptive control module implemented by the device. The order in which the method is described is not intended to be construed as a limitation, and any number or combination of the described method operations can be performed in any order to perform a method, or an alternate method.

At 302, a user interface is displayed on a display screen with curved display edges, and the user interface includes a selectable element that is selectable to initiate a device application action. For example, the display screen 108 of the wireless device 102 includes the curved display edges 110 on both vertical sides of the device, and the user interface 114 displays with selectable elements 116, such as the selectable elements 120, 122 that are user selectable to initiate corresponding device application actions 118 that are associated with a device application 112.

At 304, a determination is made that the user interface corresponds to a foreground active device application causing the selectable element of the user interface to be active. For example, the adaptive control module 126 implemented by the wireless device 102 can determine, or receive notification, that the user interface 114 corresponds to a foreground active device application 112, causing the selectable elements 116 of the user interface to be active.

At 306, grip suppression in the curved display edges of the display screen is managed, where the grip suppression limits the device application action from being initiated based on inadvertent touch inputs on the selectable element. For example, the adaptive control module 126 implemented by the wireless device 102 can adaptively manage the adaptive grip suppression 130 in the curved display edges 110 of the display screen 108, as well as in the transition regions from the flat display screen 108 into the curved display edges. The adaptive grip suppression 130 can be managed by the adaptive control module 126 to limit device application actions 118 from being initiated based on inadvertent touch inputs on the selectable elements 116 that are displayed in the curved display edges 110 of the display screen.

At 308, a determination is made that the selectable element of the user interface is displayed within a region of a curved display edge of the display screen. For example, the adaptive control module 126 implemented by the wireless device 102 can determine, or receive notification, that selectable elements 116 of the user interface 114 are displayed within the curved display edge 110 of the display screen 108, such as the selectable elements 120, 122 that are displayed in the display region 124 of the curved display edge 110 of the display screen.

At 310, the grip suppression is decreased in the region of the curved display edge proximate the selectable element of the user. For example, the adaptive control module 126 implemented by the wireless device 102 can decrease 138 the grip suppression 130 to a level that allows the device application action 118 to be initiated or activated, such as responsive to a selectable element 116 of the user interface 114 being active. The adaptive control module 126 decreasing the grip suppression 130 is effective to allow user selection of the selectable element 116 of the user interface 114 displayed within the display region 124 of the curved display edge 110 of the display screen.

At 312, a user selection of the selectable element displayed within the region of the curved display edge of the display screen is recognized as an input to initiate the device application action. For example, the adaptive control module 126 implemented by the wireless device 102 can recognize a user selection of a selectable element 120, 122 in the user interface 114, as displayed within the display region 124 of the curved display edge 110 of the display screen 108, which allows the user selection to be recognized as a touch input 132 to initiate a corresponding device application action 118.

Additionally, the adaptive control module 126 can determine that the selectable elements 116 of the user interface 114 have moved to display outside of an identified display region of the curved display edge 110 of the display screen 114. For example, the user interface 114 may be moved to display in a different location (e.g., up or down) on the display screen 108 of the wireless device 102, which moves the location of the selectable elements 120, 122 being displayed in the display region 124 of the curved display edge 110 of the display screen. The adaptive control module 126 can then determine a new region of the curved display edge 110 of the display screen 108 in which the selectable elements 120, 122 of the user interface 114 are displayed (at 308), and decrease 138 the grip suppression 130 in the new region of the curved display edge 110 proximate the selectable elements 120, 122 displayed within the new region of the curved display edge of the display screen (at 310).

Figure 4:
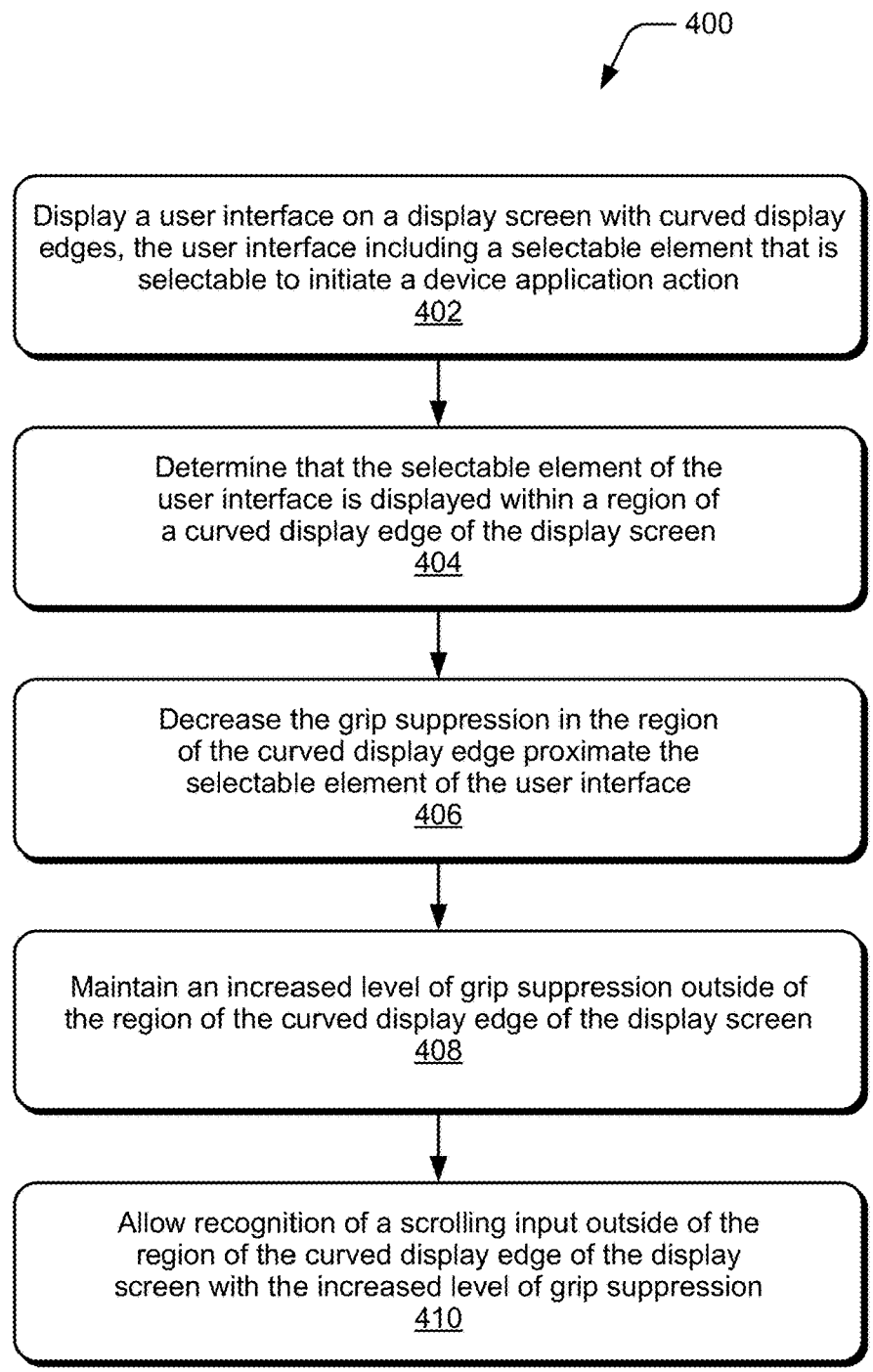

FIG. 4 illustrates example method(s) 400 of adaptive grip suppression, and is generally described with reference to a wireless device, as well as an adaptive control module implemented by the device. The order in which the method is described is not intended to be construed as a limitation, and any number or combination of the described method operations can be performed in any order to perform a method, or an alternate method.

At 402, a user interface is displayed on a display screen with curved display edges, and the user interface includes a selectable element that is selectable to initiate a device application action. For example, the display screen 108 of the wireless device 102 includes the curved display edges 110 on both vertical sides of the device, and the user interface 114 displays with selectable elements 116, such as the selectable elements 120, 122 that are user selectable to initiate corresponding device application actions 118 that are associated with a device application 112.

At 404, a determination is made that the selectable element of the user interface is displayed within a region of a curved display edge of the display screen. For example, the adaptive control module 126 implemented by the wireless device 102 can determine, or receive notification, that selectable elements 116 of the user interface 114 are displayed within the curved display edge 110 of the display screen 108, such as the selectable elements 120, 122 that are displayed in the display region 124 of the curved display edge 110 of the display screen.

At 406, the grip suppression is decreased in the region of the curved display edge proximate the selectable element of the user interface. For example, the adaptive control module 126 implemented by the wireless device 102 can decrease 138 the grip suppression 130 to a level that allows the device application action 118 to be initiated or activated, such as responsive to a selectable element 116 of the user interface 114 being active. The adaptive control module 126 decreasing the grip suppression 130 is effective to allow user selection of the selectable element 116 of the user interface 114 displayed within the display region 124 of the curved display edge 110 of the display screen.

At 408, an increased level of grip suppression is maintained outside of the region of the curved display edge of the display screen. For example, the adaptive control module 126 implemented by the wireless device 102 can maintain an increased level of grip suppression 130 to disable receiving touch inputs in the curved display edges 110, and in the transition regions from the flat display screen 108 into the curved display edges, to account for inadvertent activations that may be caused by the hand or palm coverage from a user of the device, or for device pickup movements when the user grabs the device to pick it up for use.

At 410, recognition of a scrolling input is allowed outside of the region of the curved display edge of the display screen with the increased level of grip suppression. For example, the adaptive control module 126 implemented by the wireless device 102 can still allow for recognition of swipe and/or scrolling inputs outside of the display region 124 of the curved display edge 110 of the display screen with the increased level of grip suppression.

Figure 5:
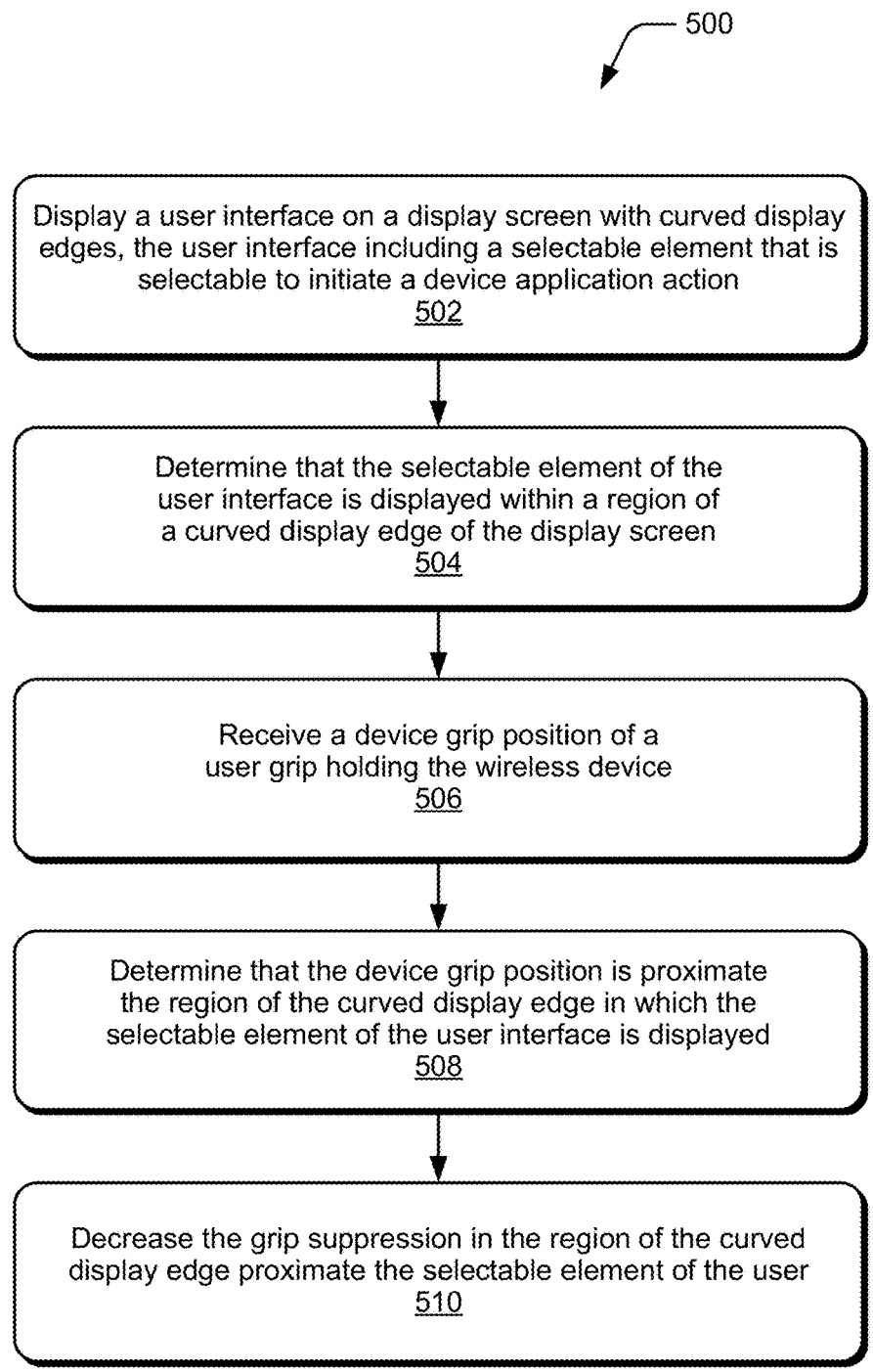

FIG. 5 illustrates example method(s) 500 of adaptive grip suppression, and is generally described with reference to a wireless device, as well as an adaptive control module implemented by the device. The order in which the method is described is not intended to be construed as a limitation, and any number or combination of the described method operations can be performed in any order to perform a method, or an alternate method.

At 502, a user interface is displayed on a display screen with curved display edges, and the user interface includes a selectable element that is selectable to initiate a device application action. For example, the display screen 108 of the wireless device 102 includes the curved display edges 110 on both vertical sides of the device, and the user interface 114 displays with selectable elements 116, such as the selectable elements 120, 122 that are user selectable to initiate corresponding device application actions 118 that are associated with a device application 112.

At 504, a determination is made that the selectable element of the user interface is displayed within a region of a curved display edge of the display screen. For example, the adaptive control module 126 implemented by the wireless device 102 can determine, or receive notification, that selectable elements 116 of the user interface 114 are displayed within the curved display edge 110 of the display screen 108, such as the selectable elements 120, 122 that are displayed in the display region 124 of the curved display edge 110 of the display screen.

At 506, a device grip position of a user grip holding the wireless device is received. For example, the adaptive control module 126 implemented by the wireless device 102 can receive a device grip position 142 of a user grip holding the wireless device 102 from the grip detection module 128. At 508, a determination is made that the device grip position is proximate the region of the curved display edge in which the selectable element of the user interface is displayed. For example, the adaptive control module 126 implemented by the wireless device 102 can then determine that the device grip position 142 is proximate the display region 124 of the curved display edge 110 in which the selectable elements 120, 122 of the user interface 114 are displayed.

At 510, the grip suppression is decreased in the region of the curved display edge proximate the selectable element of the user. For example, the adaptive control module 126 implemented by the wireless device 102 can decrease 138 the grip suppression 130 in the display region 124 of the curved display edge 110 proximate the selectable elements 120, 122, such as responsive to the device grip position 142 being proximate the display region 124 of the curved display edge 110.

Figure 6:
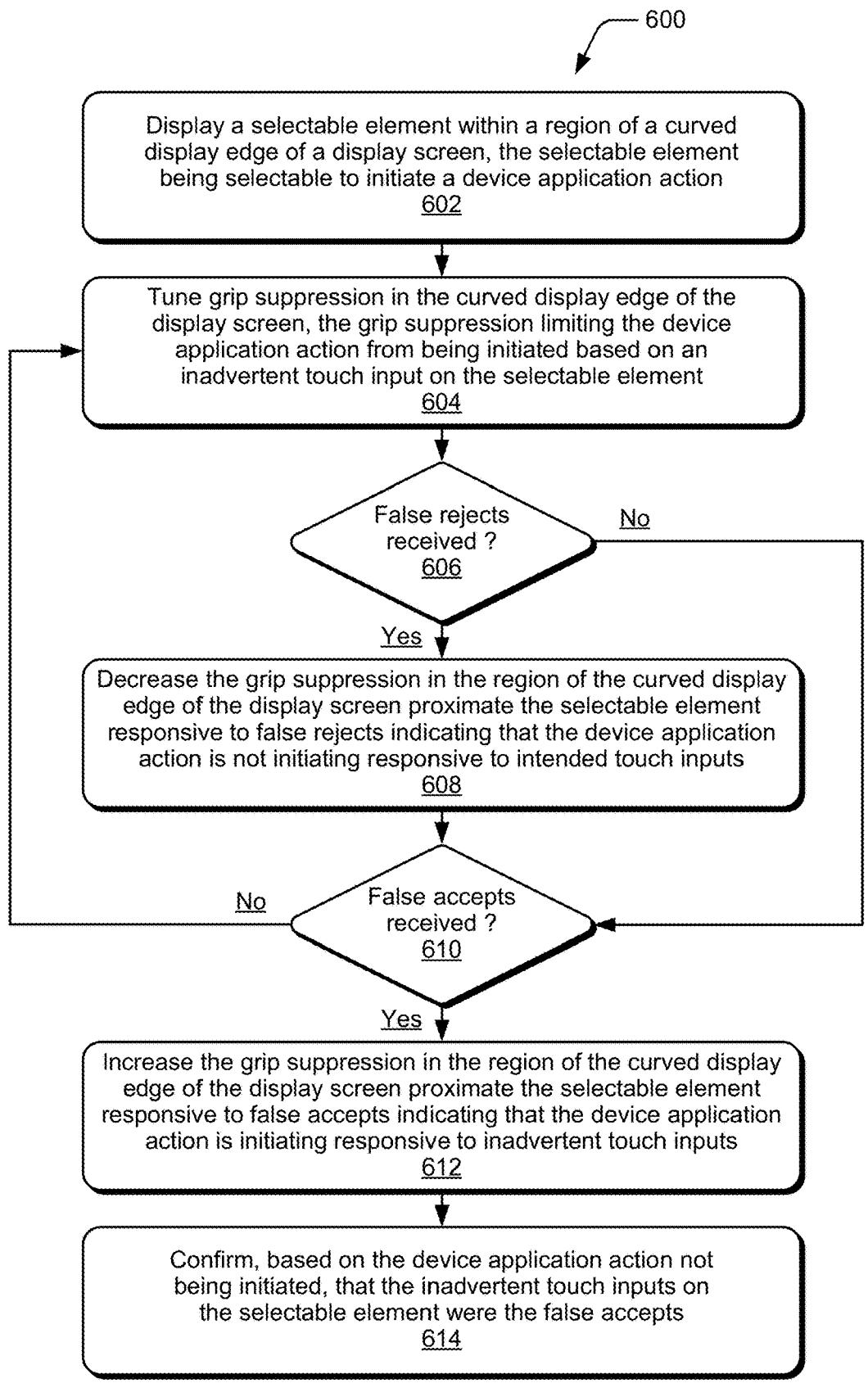
FIGS. 6-8 illustrate example methods of adaptive grip suppression tuning based on false rejects and false accepts in accordance with one or more implementations of the techniques described herein.

FIG. 6 illustrates example method(s) 600 of adaptive grip suppression, and is generally described with reference to a wireless device, as well as an adaptive control module implemented by the device. The order in which the method is described is not intended to be construed as a limitation, and any number or combination of the described method operations can be performed in any order to perform a method, or an alternate method.

At 602, a selectable element is displayed within a region of a curved display edge of a display screen, the selectable element being selectable to initiate a device application action. For example, the display screen 108 of the wireless device 102 includes the curved display edges 110 on both vertical sides of the device, with the user interface 114 including the selectable elements 120, 122 displayed in the display region 124 of the curved display edge 110, and the selectable elements 120, 122 being user selectable to initiate corresponding device application actions 118 that are associated with a device application 112.

At 604, grip suppression in the curved display edge of the display screen is tuned, and the grip suppression limits the device application action from being initiated based on an inadvertent touch input on the selectable element. For example, the adaptive control module 126 implemented by the wireless device 102 can adaptively tune the adaptive grip suppression 130 in the curved display edges 110 of the display screen 108, as well as in the transition regions from the flat display screen 108 into the curved display edges. The adaptive grip suppression 130 can be tuned by the adaptive control module 126 to limit device application actions 118 from being initiated based on inadvertent touch inputs on the selectable elements 116 that are displayed in the curved display edges 110 of the display screen.

At 606, a determination is made as to whether false rejects are received. For example, the adaptive control module 126 implemented by the wireless device 102 may receive notifications or indications of the false rejects 134 associated with intended touch inputs on a selectable element 120, 122 displayed within the display region 124 of the curved display edge 110 of the display screen 108, and the false rejects 134 indicate that the device application action 118 is not initiating responsive to the intended touch inputs. Notably, the adaptive control module 126 can receive the indications of the false rejects 134 as successive touch inputs 132 on a selectable element 116 to initiate the corresponding device application action 118. Additionally, the adaptive control module 126 can determine that the adaptive grip suppression 130 is set at a level higher than would allow the successive touch inputs on the selectable element 116 to initiate the device application action.

If false rejects are being received (i.e., "Yes" from 606), then at 608, the grip suppression is decreased in the region of the curved display edge of the display screen proximate the selectable element responsive to the false rejects indicating that the device application action is not initiating responsive to intended touch inputs. For example, the adaptive control module 126 implemented by the wireless device 102 can decrease 138 the grip suppression 130 in the display region 124 of the curved display edge 110 of the display screen 108 proximate the selectable elements 120, 122 responsive to the indications of the false rejects. The adaptive control module 126 can decrease 138 the grip suppression 130 effective to allow a touch input 132 on a selectable element 120, 122 of the user interface 114 displayed within the display region 124 of the curved display edge 110 to initiate the corresponding device application action 118.

If false rejects are not being received (i.e., "No" from 606), then at 610, a determination is made as to whether false accepts are received. For example, the adaptive control module 126 implemented by the wireless device 102 may receive notifications or indications of the false accepts 136 associated with inadvertent touch inputs on a selectable element 120, 122 displayed within the display region 124 of the curved display edge 110 of the display screen 108, and the false accepts 136 indicate that a device application action 118 is initiated responsive to the inadvertent touch inputs. Notably, the adaptive control module 126 can receive the indications of the false accepts 136 as user inputs to return to a previous device state of before the device application action 118 was initiated. The user inputs to return to the previous device state may also be determined to occur within a threshold time duration from when the device application action is initiated.

If false accepts are not being received (i.e., "No" from 610), then the method continues at 604 to tune the grip suppression in the curved display edges of the display screen. If false accepts are being received (i.e., "Yes" from 610), then at 612, the grip suppression is increased in the region of the curved display edge of the display screen proximate the selectable element responsive to false accepts indicating that the device application action is initiating responsive to inadvertent touch inputs. For example, the adaptive control module 126 implemented by the wireless device 102 can increase the grip suppression 130 effective to prevent a touch input 132 on a selectable element 120, 122 of the user interface 114 displayed within the display region 124 of the curved display edge 110 from initiating the corresponding device application action 118.

At 614, the inadvertent touch inputs on the selectable element are confirmed as having been false accepts based on the device application action not previously being initiated. For example, the adaptive control module 126 implemented by the wireless device 102 can confirm, based on the device application action 118 not being initiated, that the previous inadvertent touch inputs on the selectable element were false accepts.

Figure 7:
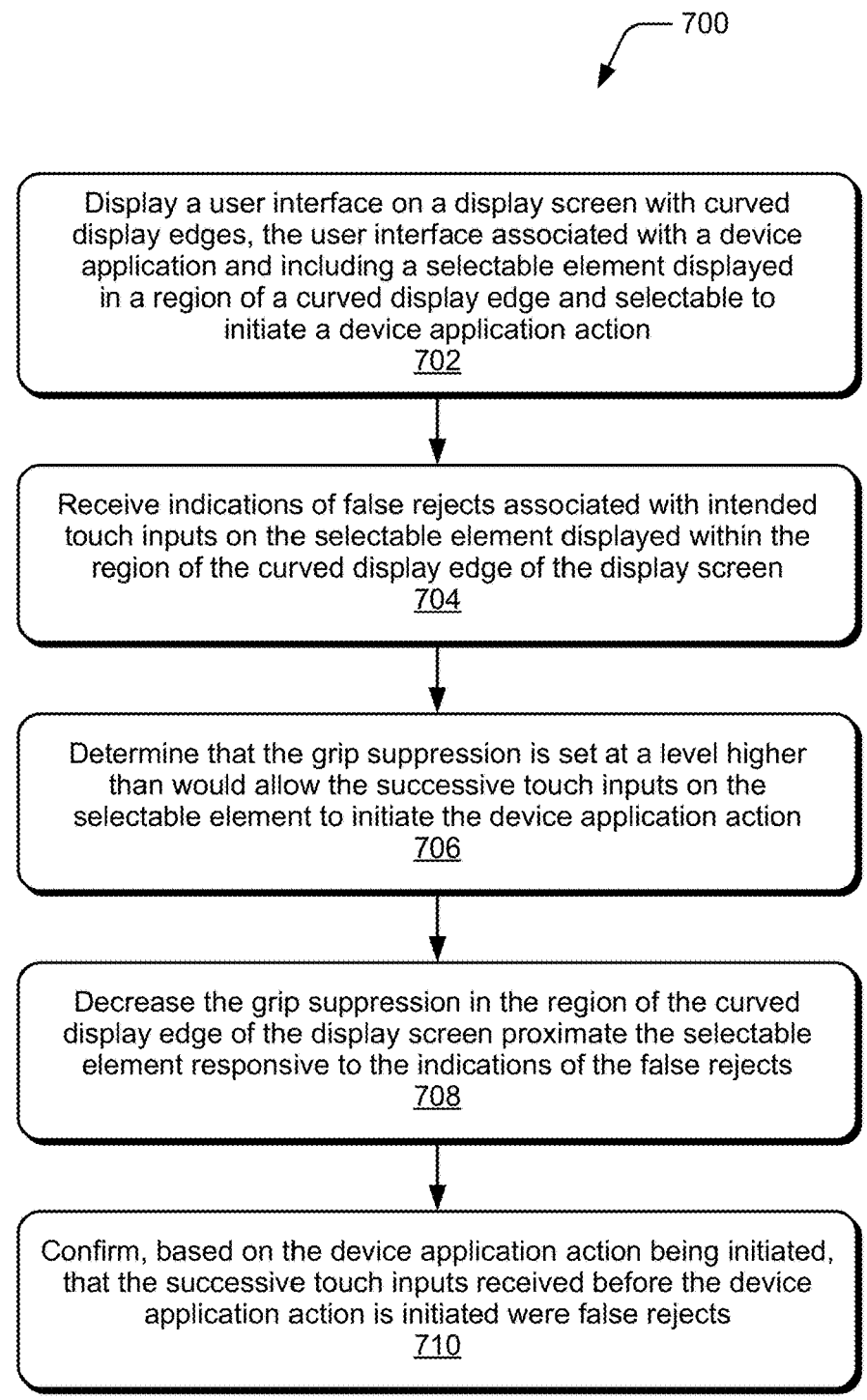

FIG. 7 illustrates example method(s) 700 of adaptive grip suppression, and is generally described with reference to a wireless device, as well as an adaptive control module implemented by the device. The order in which the method is described is not intended to be construed as a limitation, and any number or combination of the described method operations can be performed in any order to perform a method, or an alternate method.

At 702, a user interface is displayed on a display screen with curved display edges, the user interface associated with a device application and including a selectable element displayed in a region of a curved display edge and selectable to initiate a device application action. For example, the display screen 108 of the wireless device 102 includes the curved display edges 110 on both vertical sides of the device, with the user interface 114 including the selectable elements 120, 122 displayed in the display region 124 of the curved display edge 110, and the selectable elements 120, 122 being user selectable to initiate corresponding device application actions 118 that are associated with a device application 112.

At 704, indications of false rejects are received, the false rejects being associated with intended touch inputs on the selectable element displayed within the region of the curved display edge of the display screen. For example, the adaptive control module 126 implemented by the wireless device 102 may receive notifications or indications of the false rejects 134 associated with intended touch inputs on a selectable element 120, 122 displayed within the display region 124 of the curved display edge 110 of the display screen 108, and the false rejects 134 indicate that the device application action 118 is not initiating responsive to the intended touch inputs. Notably, the adaptive control module 126 can receive the indications of the false rejects 134 as successive touch inputs 132 on a selectable element 116 to initiate the corresponding device application action 118.

At 706, a determination is made that the grip suppression is set at a level higher than would allow the successive touch inputs on the selectable element to initiate the device application action. For example, the adaptive control module 126 implemented by the wireless device 102 can determine that the adaptive grip suppression 130 is set at a level higher than would allow the successive touch inputs on the selectable element 116 to initiate the device application action.

At 708, the grip suppression is decreased in the region of the curved display edge of the display screen proximate the selectable element responsive to the indications of the false rejects. For example, the adaptive control module 126 implemented by the wireless device 102 can decrease 138 the grip suppression 130 in the display region 124 of the curved display edge 110 of the display screen 108 proximate the selectable elements 120, 122 responsive to the indications of the false rejects. The adaptive control module 126 can decrease 138 the grip suppression 130 effective to allow a touch input 132 on a selectable element 120, 122 of the user interface 114 displayed within the display region 124 of the curved display edge 110 to initiate the corresponding device application action 118.

At 710, the successive touch inputs received before the device application action is initiated are confirmed as having been false rejects based on the device application action having been initiated. For example, the adaptive control module 126 implemented by the wireless device 102 can confirm, based on the device application action 118 being initiated, that the successive touch inputs 132 received before the device application action 118 is initiated were false rejects 134.

Figure 8:
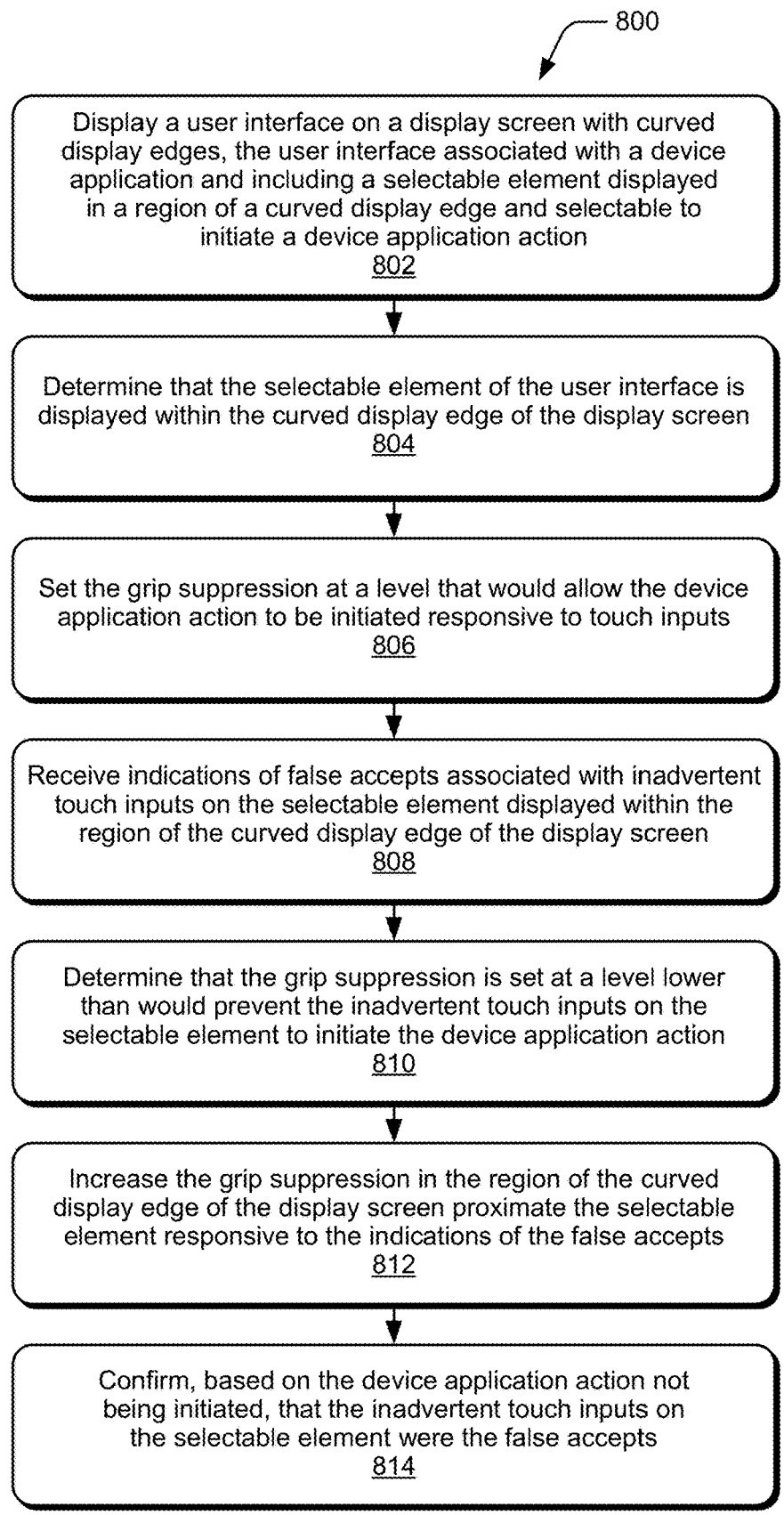

FIG. 8 illustrates example method(s) 800 of adaptive grip suppression, and is generally described with reference to a wireless device, as well as an adaptive control module implemented by the device. The order in which the method is described is not intended to be construed as a limitation, and any number or combination of the described method operations can be performed in any order to perform a method, or an alternate method.

At 802, a user interface is displayed on a display screen with curved display edges, the user interface associated with a device application and including a selectable element displayed in a region of a curved display edge and selectable to initiate a device application action. For example, the display screen 108 of the wireless device 102 includes the curved display edges 110 on both vertical sides of the device, with the user interface 114 including the selectable elements 120, 122 displayed in the display region 124 of the curved display edge 110, and the selectable elements 120, 122 being user selectable to initiate corresponding device application actions 118 that are associated with a device application 112.

At 804, a determination is made that the selectable element of the user interface is displayed within the curved display edge of the display screen. For example, the adaptive control module 126 implemented by the wireless device 102 can determine, or receive notification, that selectable elements 116 of the user interface 114 are displayed within the curved display edge 110 of the display screen 108, such as the selectable elements 120, 122 that are displayed in the display region 124 of the curved display edge 110 of the display screen.

At 806, the grip suppression is set at a level that would allow the device application action to be initiated responsive to touch inputs. For example, the adaptive control module 126 implemented by the wireless device 102 can set the adaptive grip suppression 130 at a level that would allow a device application action 118 associated with a device application 112 to be initiated responsive to touch inputs 132.

At 808, indications of false accepts are received, the false accepts being associated with inadvertent touch inputs on the selectable element displayed within the region of the curved display edge of the display screen. For example, the adaptive control module 126 implemented by the wireless device 102 may receive notifications or indications of the false accepts 136 associated with inadvertent touch inputs on a selectable element 120, 122 displayed within the display region 124 of the curved display edge 110 of the display screen 108, and the false accepts 136 indicate that a device application action 118 is initiated responsive to the inadvertent touch inputs. Notably, the adaptive control module 126 can receive the indications of the false accepts 136 as user inputs to return to a previous device state of before the device application action 118 was initiated. The user inputs to return to the previous device state may also be determined to occur within a threshold time duration from when the device application action is initiated.

At 810, a determination is made that the grip suppression is set at a level lower than would prevent the inadvertent touch inputs on the selectable element to initiate the device application action. For example, the adaptive control module 126 implemented by the wireless device 102 can determine that the adaptive grip suppression 130 is set at a level lower than would prevent the inadvertent touch inputs 132 on the selectable element to initiate the device application action.

At 812, the grip suppression is increased in the region of the curved display edge of the display screen proximate the selectable element responsive to the indications of the false accepts. For example, the adaptive control module 126 implemented by the wireless device 102 can increase 140 the grip suppression 130 in the display region 124 of the curved display edge 110 of the display screen 108 proximate the selectable elements 120, 122 responsive to the indications of the false accepts. The adaptive control module 126 can increase the grip suppression 130 effective to prevent a touch input 132 on a selectable element 120, 122 of the user interface 114 displayed within the display region 124 of the curved display edge 110 from initiating the corresponding device application action 118.

At 814, the inadvertent touch inputs on the selectable element are confirmed as having been false accepts based on the device application action not having being previously initiated. For example, the adaptive control module 126 implemented by the wireless device 102 can confirm, based on the device application action 118 not being initiated, that the previous inadvertent touch inputs on the selectable element were false accepts.

Figure 9:
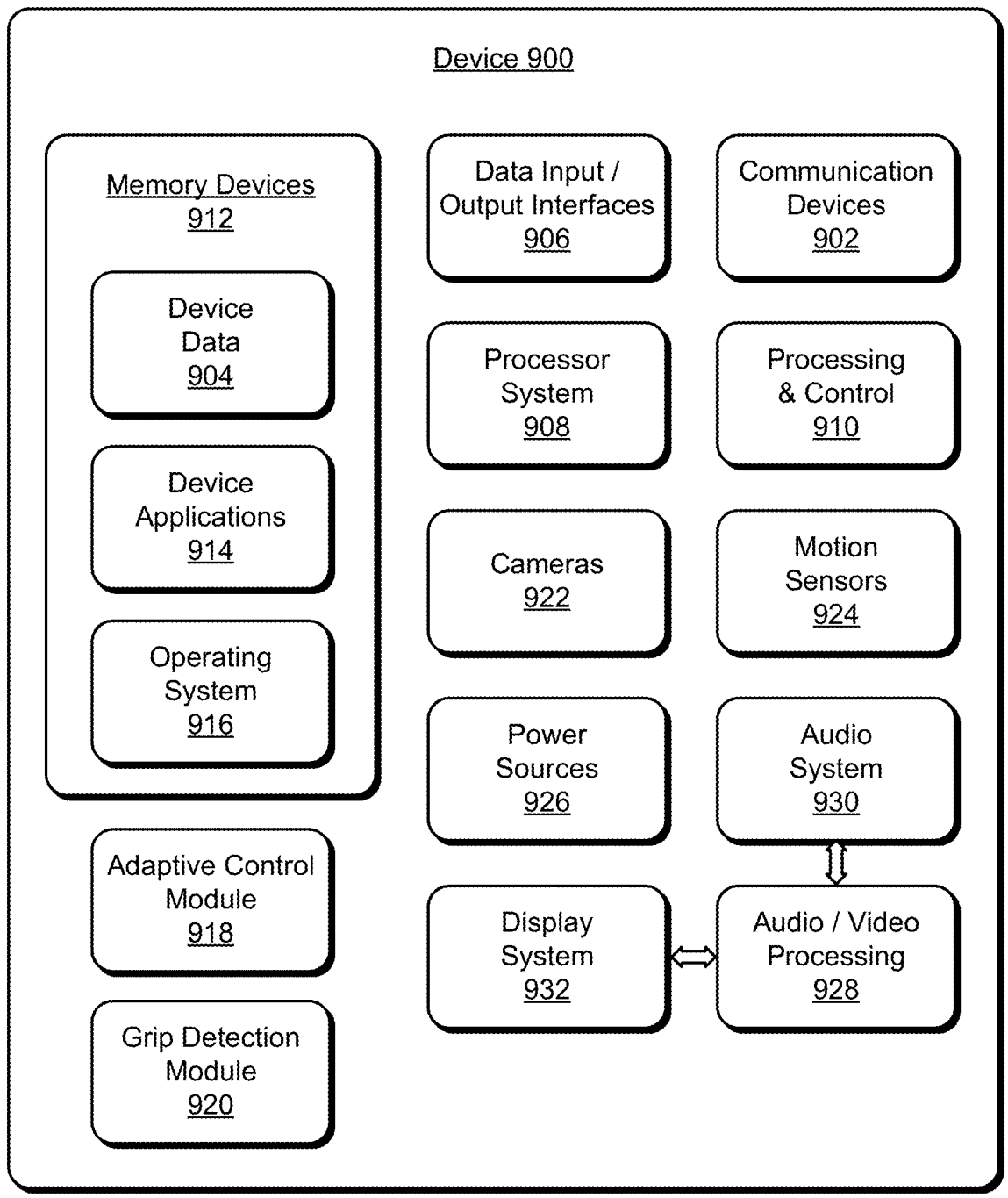
FIG. 9 illustrates various components of an example device that can be used to implement the techniques for adaptive grip suppression as described herein.

FIG. 9 illustrates various components of an example device 900, which can implement aspects of the techniques and features for adaptive grip suppression, as described herein. The example device 900 can be implemented as any of the devices described with reference to the previous FIGS. 1-8, such as any type of a wireless device, mobile device, mobile phone, flip phone, client device, companion device, paired device, display device, tablet, computing, communication, entertainment, gaming, media playback, and/or any other type of computing and/or electronic device. For example, the wireless device 102 described with reference to FIGS. 1-8 may be implemented as the example device 900.

The example device 900 can include various, different communication devices 902 that enable wired and/or wireless communication of device data 904 with other devices. The device data 904 can include any of the various device data and content that is generated, processed, determined, received, stored, and/or transferred from one computing device to another, and/or synched between multiple computing devices. Generally, the device data 904 can include any form of audio, video, image, graphics, and/or electronic data that is generated by applications executing on a device. The communication devices 902 can also include transceivers for cellular phone communication and/or for any type of network data communication.

The example device 900 can also include various, different types of data input/output (I/O) interfaces 906, such as data network interfaces that provide connection and/or communication links between the devices, data networks, and other devices. The I/O interfaces 906 can be used to couple the device to any type of components, peripherals, and/or accessory devices, such as a computer input device that may be integrated with the example device 900. The I/O interfaces 906 may also include data input ports via which any type of data, information, media content, communications, messages, and/or inputs can be received, such as user inputs to the device, as well as any type of audio, video, image, graphics, and/or electronic data received from any content and/or data source.

The example device 900 includes a processor system 908 of one or more processors (e.g., any of microprocessors, controllers, and the like) and/or a processor and memory system implemented as a system-on-chip (SoC) that processes computer-executable instructions. The processor system may be implemented at least partially in computer hardware, which can include components of an integrated circuit or on-chip system, an application-specific integrated circuit (ASIC), a field-programmable gate array (FPGA), a complex programmable logic device (CPLD), and other implementations in silicon and/or other hardware. Alternatively or in addition, the device can be implemented with any one or combination of software, hardware, firmware, or fixed logic circuitry that may be implemented in connection with processing and control circuits, which are generally identified at 910. The example device 900 may also include any type of a system bus or other data and command transfer system that couples the various components within the device. A system bus can include any one or combination of different bus structures and architectures, as well as control and data lines.

The example device 900 also includes memory and/or memory devices 912 (e.g., computer-readable storage memory) that enable data storage, such as data storage devices implemented in hardware that can be accessed by a computing device, and that provide persistent storage of data and executable instructions (e.g., software applications, programs, functions, and the like). Examples of the memory devices 912 include volatile memory and non-volatile memory, fixed and removable media devices, and any suitable memory device or electronic data storage that maintains data for computing device access. The memory devices 912 can include various implementations of random-access memory (RAM), read-only memory (ROM), flash memory, and other types of storage media in various memory device configurations. The example device 900 may also include a mass storage media device.

The memory devices 912 (e.g., as computer-readable storage memory) provide data storage mechanisms, such as to store the device data 904, other types of information and/or electronic data, and various device applications 914 (e.g., software applications and/or modules). For example, an operating system 916 can be maintained as software instructions with a memory device and executed by the processor system 908 as a software application. The device applications 914 may also include a device manager, such as any form of a control application, software application, signal-processing and control module, code that is specific to a particular device, a hardware abstraction layer for a particular device, and so on.

In this example, the device 900 includes an adaptive control module 918 and a grip detection module 920 that implement various aspects of the described features and techniques for adaptive grip suppression. The modules may each be implemented with hardware components and/or in software as one of the device applications 914, such as when the example device 900 is implemented as the wireless device 102 described with reference to FIGS. 1-8. An example of the adaptive control module 918 includes the adaptive control module 126, and an example of the grip detection module 920 includes the grip detection module 128 as implemented by the wireless device 102, such as software applications and/or as hardware components in the wireless device. In implementations, the adaptive control module 918 and the grip detection module 920 may include independent processing, memory, and logic components as a computing and/or electronic device integrated with the example device 900.

The example device 900 can also include cameras 922 and/or motion sensors 924, such as may be implemented as components of an inertial measurement unit (IMU). The motion sensors 924 can be implemented with various sensors, such as a gyroscope, an accelerometer, and/or other types of motion sensors to sense motion of the device. The motion sensors 924 can generate sensor data vectors having three-dimensional parameters (e.g., rotational vectors in x, y, and z-axis coordinates) indicating location, position, acceleration, rotational speed, and/or orientation of the device. The example device 900 can also include one or more power sources 926, such as when the device is implemented as a wireless device and/or mobile device. The power sources may include a charging and/or power system, and can be implemented as a flexible strip battery, a rechargeable battery, a charged super-capacitor, and/or any other type of active or passive power source.

The example device 900 can also include an audio and/or video processing system 928 that generates audio data for an audio system 930 and/or generates display data for a display system 932. The audio system and/or the display system may include any types of devices that generate, process, display, and/or otherwise render audio, video, display, and/or image data. Display data and audio signals can be communicated to an audio component and/or to a display component via any type of audio and/or video connection or data link. In implementations, the audio system and/or the display system are integrated components of the example device 900. Alternatively, the audio system and/or the display system are external, peripheral components to the example device.

Although implementations of adaptive grip suppression have been described in language specific to features and/or methods, the appended claims are not necessarily limited to the specific features or methods described. Rather, the specific features and methods are disclosed as example implementations of adaptive grip suppression, and other equivalent features and methods are intended to be within the scope of the appended claims. Further, various different examples are described and it is to be appreciated that each described example can be implemented independently or in connection with one or more other described examples. Additional aspects of the techniques, features, and/or methods discussed herein relate to one or more of the following:

A wireless device, comprising: a display screen with curved display edges to display a user interface associated with a device application, the user interface including a selectable element displayable in a region of a curved display edge and selectable to initiate a device application action; an adaptive control module implemented at least partially in hardware to adaptively tune grip suppression in the curved display edges of the display screen, the grip suppression limiting the device application action from being initiated based on inadvertent touch inputs on the selectable element, the adaptive control module configured to: receive indications of false rejects associated with intended touch inputs on the selectable element displayed within the region of the curved display edge of the display screen, the false rejects indicating that the device application action is not initiating responsive to the intended touch inputs; and decrease the grip suppression in the region of the curved display edge of the display screen proximate the selectable element responsive to the indications of the false rejects.

Alternatively or in addition to the above described wireless device, any one or combination of: the adaptive control module is configured to decrease the grip suppression effective to allow a touch input on the selectable element of the user interface displayed within the region of the curved display edge of the display screen to initiate the device application action. The adaptive control module is configured to receive the indications of the false rejects as successive touch inputs on the selectable element to initiate the device application action. The adaptive control module is configured to determine that the grip suppression is set at a level higher than would allow the successive touch inputs on the selectable element to initiate the device application action. The adaptive control module is configured to: receive the indications of the false rejects as successive touch inputs on the selectable element to initiate the device application action; decrease the grip suppression effective to allow a touch input on the selectable element of the user interface to initiate the device application action; and confirm, based on the device application action being initiated, that the successive touch inputs received before the device application action is initiated were the false rejects.

A wireless device, comprising: a display screen with curved display edges to display a user interface associated with a device application, the user interface including a selectable element displayable in a region of a curved display edge and selectable to initiate a device application action; an adaptive control module implemented at least partially in hardware to adaptively tune grip suppression in the curved display edges of the display screen, the grip suppression limiting the device application action from being initiated based on inadvertent touch inputs on the selectable element, the adaptive control module configured to: receive indications of false accepts associated with the inadvertent touch inputs on the selectable element displayed within the region of the curved display edge of the display screen, the false accepts indicating that the device application action is initiated responsive to the inadvertent touch inputs; and increase the grip suppression in the region of the curved display edge of the display screen proximate the selectable element responsive to the indications of the false accepts.

Alternatively or in addition to the above described wireless device, any one or combination of: the adaptive control module is configured to increase the grip suppression effective to prevent a touch input on the selectable element of the user interface displayed within the region of the curved display edge of the display screen initiating the device application action. The adaptive control module is configured to determine that the grip suppression is set at a level lower than would prevent the inadvertent touch inputs on the selectable element to initiate the device application action. The adaptive control module is configured to: determine that the selectable element of the user interface is displayed within the curved display edge of the display screen; and before the indications of the false accepts are received, initially set the grip suppression at a level that would allow the device application action to be initiated responsive to touch inputs. The adaptive control module is configured to receive the indications of the false accepts as user inputs to return to a previous device state of before the device application action was initiated. The user inputs to return to the previous device state occur within a threshold time duration from when the device application action is initiated. The adaptive control module is configured to: receive the indications of the false accepts as user inputs to return to a previous device state of before the device application action was initiated; increase the grip suppression effective to prevent a touch input on the selectable element of the user interface initiating the device application action; and confirm, based on the device application action not being initiated, that the inadvertent touch inputs on the selectable element were the false accepts.

A method, comprising: displaying a selectable element within a region of a curved display edge of a display screen, the selectable element being selectable to initiate a device application action; tuning grip suppression in the curved display edge of the display screen, the grip suppression limiting the device application action from being initiated based on an inadvertent touch input on the selectable element, the tuning the grip suppression including: decreasing the grip suppression in the region of the curved display edge of the display screen proximate the selectable element responsive to false rejects indicating that the device application action is not initiating responsive to intended touch inputs; or increasing the grip suppression in the region of the curved display edge of the display screen proximate the selectable element responsive to false accepts indicating that the device application action is initiating responsive to inadvertent touch inputs.

Alternatively or in addition to the above described method, any one or combination of: decreasing the grip suppression is effective to allow a touch input on the selectable element displayed within the region of the curved display edge of the display screen to initiate the device application action. The increasing the grip suppression is effective to prevent a touch input on the selectable element displayed within the region of the curved display edge of the display screen initiating the device application action. The method further comprising receiving indications of the false rejects as successive touch inputs on the selectable element to initiate the device application action. The method further comprising determining that the grip suppression is set at a level higher than would allow the successive touch inputs on the selectable element to initiate the device application action. The method further comprising receiving indications of the false accepts as user inputs to return to a previous device state of before the device application action was initiated. The user inputs to return to the previous device state occur within a threshold time duration from when the device application action is initiated. The method further comprising: receiving indications of the false accepts as user inputs to return to a previous device state of before the device application action was initiated; the increase the grip suppression is effective to prevent a touch input on the selectable element of the user interface initiating the device application action; and confirming, based on the device application action not being initiated, that the inadvertent touch inputs on the selectable element were the false accepts.

The invention claimed is:
1. A wireless device, comprising:
a display screen with curved display edges to display a user interface associated with a device application, the user interface including a selectable element displayable in a region of a curved display edge and selectable to initiate a device application action;
an adaptive control module implemented at least partially in hardware to adaptively tune grip suppression in the curved display edges of the display screen, the grip suppression limiting the device application action from being initiated based on inadvertent touch inputs on the selectable element, the adaptive control module configured to:
receive, as indications of false rejects, successive touch inputs on the selectable element displayed within the region of the curved display edge of the display screen without the device application action initiating responsive to the successive touch inputs; and
decrease the grip suppression in the region of the curved display edge of the display screen proximate the selectable element responsive to the indications of the false rejects.

2. The wireless device of claim 1, wherein the adaptive control module is configured to decrease the grip suppression effective to allow a touch input on the selectable element of the user interface displayed within the region of the curved display edge of the display screen to initiate the device application action.

3. The wireless device of claim 1, wherein the adaptive control module is configured to determine that the grip suppression is set at a level higher than would allow the successive touch inputs on the selectable element to initiate the device application action.

4. The wireless device of claim 1, wherein the adaptive control module is configured to:
decrease the grip suppression effective to allow a touch input on the selectable element of the user interface to initiate the device application action; and
confirm, based on the device application action being initiated, that the successive touch inputs received before the device application action is initiated were the false rejects.

5. A wireless device, comprising:
a display screen with curved display edges to display a user interface associated with a device application, the user interface including a selectable element displayable in a portion of a curved display edge and selectable to initiate a device application action;
an adaptive control module implemented at least partially in hardware to adaptively tune grip suppression in the curved display edges of the display screen, the grip suppression limiting the device application action from being initiated based on inadvertent touch inputs on the selectable element, the adaptive control module configured to:
receive indications of false accepts associated with the inadvertent touch inputs on the selectable element displayed within the portion of the curved display edge of the display screen, the false accepts indicating that the device application action is initiated responsive to the inadvertent touch inputs; and
increase the grip suppression in the portion of the curved display edge of the display screen that includes the selectable element responsive to the indications of the false accepts.

6. The wireless device of claim 5, wherein the adaptive control module is configured to increase the grip suppression effective to prevent a touch input on the selectable element of the user interface displayed within the portion of the curved display edge of the display screen from initiating the device application action.

7. The wireless device of claim 5, wherein the adaptive control module is configured to determine that the grip suppression is set at a level lower than would prevent the inadvertent touch inputs on the selectable element to initiate the device application action.

8. The wireless device of claim 5, wherein the adaptive control module is configured to:
determine that the selectable element of the user interface is displayed within the curved display edge of the display screen; and
before the indications of the false accepts are received, initially set the grip suppression in the portion of the curved display edge at a level that would allow the device application action to be initiated responsive to touch inputs.

9. The wireless device of claim 5, wherein the adaptive control module is configured to receive the indications of the false accepts as user inputs to return to a previous device state of before the device application action was initiated, the user inputs received after the inadvertent touch inputs.

10. The wireless device of claim 8, wherein the user inputs to return to the previous device state occur within a threshold time duration from when the device application action is initiated.

11. The wireless device of claim 4, wherein the adaptive control module is configured to:
receive the indications of the false accepts as user inputs to return to a previous device state of before the device application action was initiated, the user inputs received after the inadvertent touch inputs;
increase the grip suppression effective to prevent a touch input on the selectable element of the user interface initiating the device application action; and
confirm, based on the device application action not being initiated, that the inadvertent touch inputs on the selectable element were the false accepts.

12. A method, comprising:
displaying a selectable element within a portion of a curved display edge of a display screen, the selectable element being selectable to initiate a device application action;
tuning grip suppression in the curved display edge of the display screen, the grip suppression limiting the device application action from being initiated based on an inadvertent touch input on the selectable element, the tuning the grip suppression including:
decreasing the grip suppression in the portion of the curved display edge of the display screen that includes the selectable element responsive to receiving false rejects as successive touch inputs on the selectable element without the device application action initiating responsive to the successive touch inputs; and
increasing the grip suppression in the portion of the curved display edge of the display screen that includes the selectable element responsive to receiving false accepts indicating that the device application action is initiating responsive to inadvertent touch inputs.

13. The method of claim 12, wherein the decreasing the grip suppression is effective to allow a touch input on the selectable element displayed within the portion of the curved display edge of the display screen to initiate the device application action.

14. The method of claim 12, wherein the increasing the grip suppression is effective to prevent a touch input on the selectable element displayed within the portion of the curved display edge of the display screen initiating the device application action.

15. The method of claim 12, further comprising determining that the grip suppression is set at a level higher than would allow the successive touch inputs on the selectable element to initiate the device application action.

16. The method of claim 12, further comprising receiving indications of the false accepts as user inputs to return to a previous device state of before the device application action was initiated, the user inputs received after the inadvertent touch inputs.

17. The method of claim 16, wherein the user inputs to return to the previous device state occur within a threshold time duration from when the device application action is initiated.

18. The method of claim 12, further comprising:
- receiving indications of the false accepts as user inputs to return to a previous device state of before the device application action was initiated, the user inputs received after the inadvertent touch inputs;
- the increasing the grip suppression is effective to prevent a touch input on the selectable element from initiating the device application action; and
- confirming, based on the device application action not being initiated, that the inadvertent touch inputs on the selectable element were the false accepts.

19. The wireless device of claim 1, wherein the adaptive control module is configured to maintain an increased grip suppression in additional regions of the curved display edge outside the region of the curved display edge of the display screen proximate the selectable element.

20. The wireless device of claim 19, wherein the adaptive control module is configured to disable receiving of touch inputs and enable receiving of swipe inputs outside the region of the curved display edge with the increased grip suppression.

* * * * *